(12) United States Patent
Wu et al.

(10) Patent No.: US 6,890,868 B2
(45) Date of Patent: May 10, 2005

(54) PROCESS FOR DEPOSITING GELABLE COMPOSITION THAT INCLUDES DISSOLVING GELABLE COMPOSITION IN LIQUID WITH AGITATING TO DISRUPT GELLING

(75) Inventors: Yiliang Wu, Mississauga (CA); Ping Liu, Mississauga (CA); Beng S. Ong, Mississauga (CA); Dasarao K. Murti, Mississauga (CA)

(73) Assignee: Xerox Corporation, Stamford, CT (US)

( * ) Notice: Subject to any disclaimer, the term of this patent is extended or adjusted under 35 U.S.C. 154(b) by 93 days.

(21) Appl. No.: 10/273,896

(22) Filed: Oct. 17, 2002

(65) Prior Publication Data

US 2004/0075120 A1 Apr. 22, 2004

(51) Int. Cl.[7] .............................................. H01L 21/47
(52) U.S. Cl. ........................................ 438/781; 427/384
(58) Field of Search ................................ 438/780, 781, 438/782; 427/384

(56) References Cited

U.S. PATENT DOCUMENTS

| | | | | |
|---|---|---|---|---|
| 4,605,607 A | * | 8/1986 | Nikles et al. ................... | 430/17 |
| 5,059,266 A | * | 10/1991 | Yamane et al. ................. | 156/64 |
| 5,273,657 A | * | 12/1993 | Nakashima et al. ........... | 210/640 |
| 5,336,736 A | * | 8/1994 | Nakano et al. ................. | 525/474 |
| 5,440,025 A | * | 8/1995 | Marx et al. .................... | 536/25.4 |
| 5,457,160 A | * | 10/1995 | Allcock et al. ................ | 525/188 |
| 6,171,663 B1 | * | 1/2001 | Hanada et al. ................. | 349/139 |
| 6,211,274 B1 | * | 4/2001 | Tanegashima et al. ........ | 524/399 |
| 2003/0087195 A1 | * | 5/2003 | Kim et al. ....................... | 430/313 |

FOREIGN PATENT DOCUMENTS

WO    WO 00/79617 A1    12/2000

OTHER PUBLICATIONS

F. Brustolin et al., "Highly Ordered Structures of Amphiphilic Polythiophenes in Aqueous Media," *Macromolecules*, vol. 35, pp. 1054–1059 (published on web Jan. 3, 2002).

G. Dufresne et al., "Thermochronic and Solvatochromic Conjugated Polymers by Design," *Macromolecules*, vol. 33, pp. 8252–8257 (published on web Sep. 30, 2000).

M. Leclerc, Optical and Electrochemical Transducers Based on Functionalized Conjugated Polymers, *Adv. Mater.*, vol. 11, No. 18, pp. 1491–1498 (1999).

Yiliang Wu et al., U.S. Appl. No. 10/273,901; (filed on Oct. 17, 2002), titled "Process and Device Using Self–Organizable Polymer".

* cited by examiner

*Primary Examiner*—Stephen W. Smoot
(74) *Attorney, Agent, or Firm*—Zosan S. Soong

(57) ABSTRACT

A process including: (a) selecting a composition including a polymer and a liquid, wherein the polymer exhibits lower solubility in the liquid at room temperature but exhibits greater solubility in the liquid at an elevated temperature, wherein the composition gels when the elevated temperature is lowered to a first lower temperature without agitation; (b) dissolving at the elevated temperature at least a portion of the polymer in the liquid; (c) lowering the temperature of the composition from the elevated temperature to the first lower temperature; (d) agitating the composition to disrupt any gelling, wherein the agitating commences at any time prior to, simultaneous with, or subsequent to the lowering the elevated temperature of the composition to the first lower temperature: (e) depositing a layer of the composition wherein the composition is at a second lower temperature lower than the elevated temperature; and (f) drying at least partially the layer.

8 Claims, 2 Drawing Sheets

PROCESS FOR DEPOSITING GELABLE COMPOSITION THAT INCLUDES DISSOLVING GELABLE COMPOSITION IN LIQUID WITH AGITATING TO DISRUPT GELLING

BACKGROUND OF THE INVENTION

Polymer thin film transistors have potential applications for fabricating low-cost integrated circuits for large-area/low-end electronic devices such as active matrix liquid crystal displays, electronic paper, smart cards, radio frequency identification tags, and the like. They have the added advantages of being mechanically durable and compatible with flexible substrates, thus offering the potential of fabricating structurally flexible electronic devices. Two critical requirements for these low-cost applications are sufficient charge carrier mobility and solution processability.

Higher charge carrier mobility can be achieved through enabling material design and process innovation as disclosed in PCT WO 00/79617 A1 and Yiliang Wu et al., U.S. Ser. No. 10/273,901 (filed on Oct. 17, 2002) titled "Process and Device Using Self-Organizable Polymer." Solution processability of materials at room temperature or other temperatures slightly above room temperature is generally advantageous due to the lower energy requirement and the simplification in equipment. However, certain polymers may gel at these temperatures which renders the gelled composition unable to be satisfactorily solution coated. Thus, there is a need, which the present invention addresses, for new techniques to enable the fabrication of polymer thin film transistors at a temperature lower than an elevated temperature using polymers that are capable of gelling.

The following documents also may be relevant:

F. Brustolin et al., "Highly Ordered Structures of Amphiphilic Polythiophenes in Aqueous Media," *Macromolecules*, Vol. 35, pp. 1054–1059 (published on web Jan. 3, 2002).

G. Dufresne et al., "Thermochromic and Solvatochromic Conjugated Polymers by Design," *Macromolecules*, Vol. 33, pp. 8252–8257 (published on web Sep. 30, 2000).

M. Leclerc, "Optical and Electrochemical Transducers Based on Functionalized Conjugated Polymers, *Adv. Mater.*, Vol. 11, No. 18, pp. 1491–1498 (1999).

SUMMARY OF THE INVENTION

The present invention is accomplished in embodiments by providing a process comprising:

selecting a composition including a polymer and a liquid, wherein the polymer exhibits lower solubility in the liquid at room temperature but exhibits greater solubility in the liquid at an elevated temperature, wherein the composition gels when the elevated temperature is lowered to a first lower temperature without agitation;

dissolving at the elevated temperature at least a portion of the polymer in the liquid;

lowering the temperature of the composition from the elevated temperature to the first lower temperature;

agitating the composition to disrupt any gelling, wherein the agitating commences at any time prior to, simultaneous with, or subsequent to the lowering the elevated temperature of the composition to the first lower temperature;

depositing a layer of the composition wherein the composition is at a second lower temperature lower than the elevated temperature; and drying at least partially the layer.

In embodiments, there is also provided a process comprising:

selecting a composition including a self-organizable polymer and a liquid, wherein the polymer exhibits lower solubility in the liquid at room temperature but exhibits greater solubility in the liquid at an elevated temperature, wherein the composition gels when the elevated temperature is lowered to a first lower temperature without agitation;

dissolving at the elevated temperature at least a portion of the polymer in the liquid;

lowering the temperature of the composition from the elevated temperature to the first lower temperature;

agitating the composition to disrupt any gelling, wherein the agitating commences at any time prior to, simultaneous with, or subsequent to the lowering the elevated temperature of the composition to the first lower temperature;

depositing via solution coating a layer of the composition wherein the composition is at a second lower temperature lower than the elevated temperature; and drying at least partially the layer.

There is further provided in embodiments a thin film transistor comprising:

an insulating layer;

a gate electrode;

a structurally ordered semiconductor layer;

a source electrode; and a drain electrode, wherein the insulating layer, the gate electrode, the semiconductor layer, the source electrode, and the drain electrode are in any sequence as long as the gate electrode and the semiconductor layer both contact the insulating layer, and the source electrode and the drain electrode both contact the semiconductor layer, wherein the semiconductor layer is prepared by a process comprising:

selecting a composition including a self-organizable polymer and a liquid, wherein the polymer exhibits lower solubility in the liquid at room temperature but exhibits greater solubility in the liquid at an elevated temperature, wherein the composition gels when the elevated temperature is lowered to a first lower temperature without agitation;

dissolving at the elevated temperature at least a portion of the polymer in the liquid;

lowering the temperature of the composition from the elevated temperature to the first lower temperature;

agitating the composition to disrupt any gelling, wherein the agitating commences at any time prior to, simultaneous with, or subsequent to the lowering the elevated temperature of the composition to the first lower temperature;

depositing via solution coating a layer of the composition, resulting in the semiconductor layer, wherein the composition is at a second lower temperature lower than the elevated temperature; and drying at least partially the layer.

BRIEF DESCRIPTION OF THE DRAWINGS

Other aspects of the present invention will become apparent as the following description proceeds and upon reference to the Figures which represent illustrative embodiments.

Unless otherwise noted, the same reference numeral in different Figures refers to the same or similar feature.

DETAILED DESCRIPTION

Figure 1:
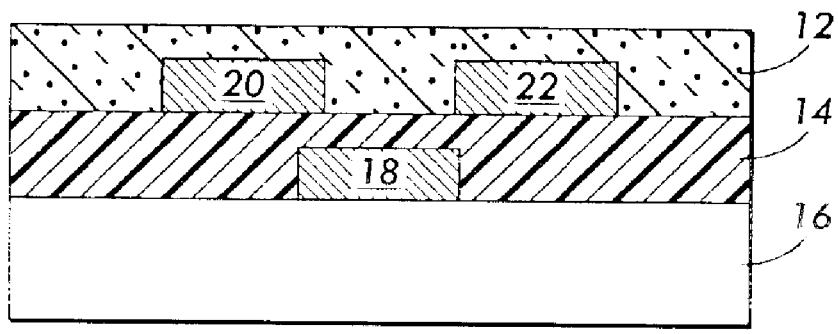
FIG. 1 represents a first embodiment of a thin film transistor made using the present process.

Any polymer which is capable of gelling may be used in the present invention. The phrase "capable of gelling" refers to when a composition including the polymer and a liquid is subjected first to an elevated temperature (exemplary elevated temperatures are discussed herein) and then to a first lower temperature (exemplary first lower temperatures are discussed herein), where gelling occurs when the temperature reduction is accomplished without agitation. This gelling is referred to as physical gelling as no covalent bonding occurs. In the absence of agitation, such gelling typically occurs in a timeframe ranging for example from about 5 seconds to about one hour. The term "gelling" or "gel" refers to formation of a three-dimensional polymer network of a polymer in a liquid through intermolecular interaction such as hydrogen bonding, van der Waals interactions, while the liquid is adsorbed in the three-dimensional network.

The polymer may be considered to exhibit poor solubility in a liquid when the concentration of the polymer in a saturated solution in that liquid is not high enough to make a thin polymer layer that is useful for the intended applications by common deposition techniques. Generally, when the concentration of the polymer in a particular liquid is below about 0.1 percent by weight, its solubility in that liquid is deemed to be poor. Even though the polymer may exhibit low solubility in a liquid at room temperature, its solubility can generally be increased by heating above room temperature.

When the concentration is higher than about 0.2 percent by weight, the polymer is considered to exhibit reasonable solubility as a useful thin polymer layer may be fabricated from this solution using common deposition processes.

The phrase "room temperature" refers to a temperature ranging from about 22 to about 25 degrees C.

In embodiments, one, two, three or more different polymers may be employed.

The polymer may be for example a self-organizable polymer. Molecular self-organization refers to the ability of molecules to organize themselves into a higher molecular structural order in response to a stimulus such as a change in solvency of the liquid for the polymer. Self-organizable polymers include for example conjugated polymers such as for instance polythiophenes. Exemplary polythiophenes include for instance the following:

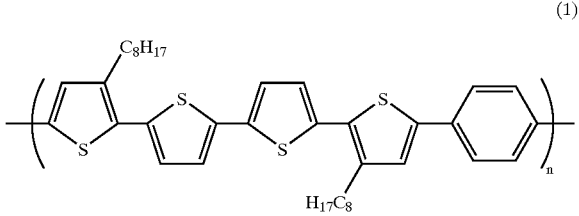

(1)

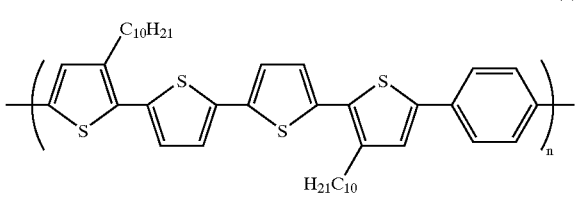

(2)

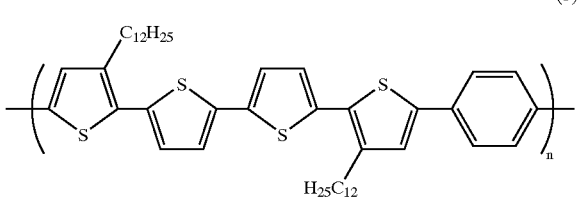

(3)

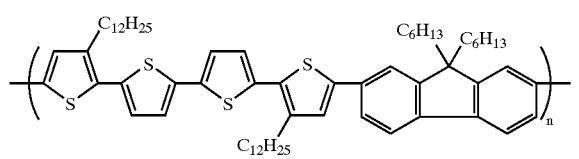

(4)

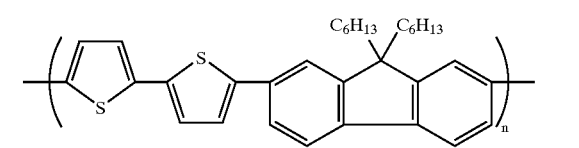

(5)

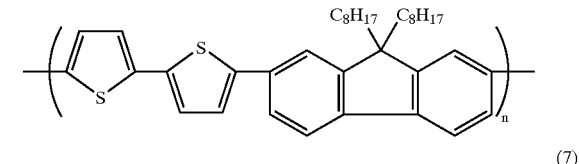

(6)

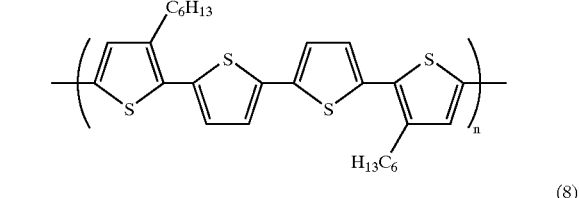

(7)

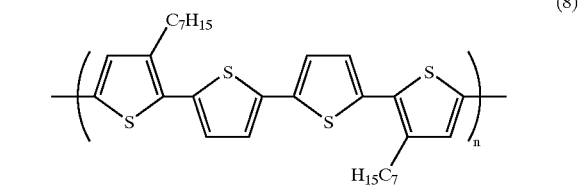

(8)

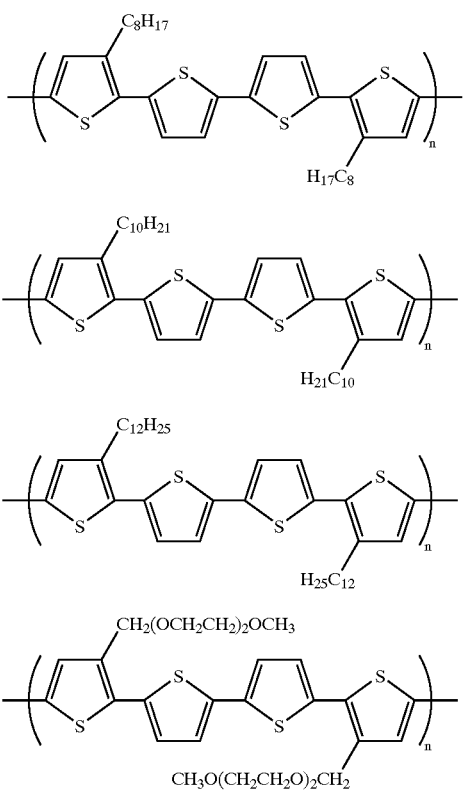

where n is from about 5 to about 5,000.

Suitable polyrhiophenca are disclosed in U.S. Ser. No. 10/042,356 which issued as U.S. Pat. No. 6.621.099, U.S. Ser. No. 10/042,358 which has been published as U.S. Published Application 2003/0160230, and U.S. Ser. No. 10/042,342 which has been published as U.S. Published Application 2003/0160234, the disclosures of which are totally incorporated herein by reference.

In the composition, the polymer or polymers are completely dissolved or partially dissolved in a liquid at an elevated temperature. Agitation may be optionally employed to aid the dissolution. Undissolved polymer may be optionally removed by filtration. The amount of the polymer dissolved in the liquid at the elevated temperature may range for example from about 0.1% to as much as about 50% by weight of the polymer. In embodiments, the concentration of the polymer in the liquid at the elevated temperature ranges for example from about 0.1% to about 30% by weight, particularly from about 0.2% to about 5% by weight, based on the total weight of the liquid and the polymer.

Heat is employed to aid the dissolution of the polymer at an elevated temperature for a period of time ranging for instance from about 1 minutes to about 24 hours, particularly from about 10 minutes to about 4 hours.

As used herein, the phrase "elevated temperature" refers to a temperature ranging from above room temperature to the boiling point or higher of the chosen liquid (at one atmosphere or higher pressure), for example from about 40 to about 180 degrees C., particularly from about 50 to about 120 degrees C.

The liquid may be for instance dichloroethane, chloroform, tetrahydrofuran, chlorobenzene, dichlorobenzene, trichlorobenzene, nitrobenzene, toluene, xylene, mesitylene, 1,2,3,4-tetrahydronaphthelene, dichloromethane, 1,2-dichloroethane trichloroethane, 1,1,2,2,-chloroethane, or a mixture thereof.

Although the composition can be used for device preparation at the elevated temperature, the use of the elevated temperature will increase the manufacturing cost. Thus, to lower the manufacturing cost, the temperature of the composition is lowered from the elevated temperature to the first lower temperature. The first lower temperature may be a temperature ranging from below room temperature to below the elevated temperature such as for example from about 10 to about 60 degrees C., particularly from about 20 to about 30 degrees C., and especially at room temperature. In embodiments, the temperature is lowered from the elevated temperature to the first lower temperature by an amount ranging for instance from about 10 to about 150 degrees C., particularly from about 20 to about 80 degrees C. The composition is maintained at the first lower temperature for a time period ranging for example from about 10 minutes to about 10 hours, particularly from about 30 minutes to about 4 hours.

To disrupt any gelling when the elevated temperature is lowered to the first lower temperature, the composition is subjected to agitation wherein the agitating commences at any time prior to, simultaneous with, or subsequent to the lowering the elevated temperature of the composition to the first lower temperature. The agitation is maintained for a sufficient time to disrupt any gelling of the composition such as an agitation time ranging for example from about 5 minutes to about 20 hours. The intensity of the agitation may be constant or may vary throughout the agitation time. Exemplary agitation methods include for instance, stirring and homogenization with the mixing speed ranging for example from about 1000 rpm to about 5000 rpm, and ultrasonic vibration with a sonicator wattage ranging for example from about 100 W to about 400 W and a sonicator frequency ranging for example from about 20 kHz to about 42 kHz.

Gelling is generally undesirable since a composition turned to a gel is difficult to solution coat at room temperature; but gelling is an indicator of increased structural order of certain self-organizable polymers. The composition is subjected to agitation as described herein to disrupt any gelling. In embodiments, visibly observable gelled material may exist despite the agitation; such gelled material surviving the agitation may be optionally removed by for example filtration.

In embodiments of the present process, the polymer molecules may come together to form structurally ordered polymer aggregates in the liquid during the agitation. The polymer aggregates are for example nanometer sized with a size ranging for instance from about 10 nm to about 500 nm, particularly from about 150 nm to about 300 nm.

When a self-organizable polymer is used, the polymer aggregates in the liquid may exhibit in embodiments structural ordering, yielding structurally ordered polymer aggregates. The phrase "structurally ordered polymer aggregates" refers to the aggregation of polymer molecules wherein the spatial orientations or arrangements of the molecules relative to their surrounding neighboring molecules within the aggregation are orderly in nature. For instance the polymer molecules may align themselves with their backbones parallel to one another. Changes in molecular ordering of the polymer in a composition may be monitored by spectroscopic methods, for instance, absorption spectroscopy, optical spectroscopy, NMR, light scattering and X-ray diffraction analysis, and by transmission electron microscopy. A known example is regioregular poly (3-alkylthiophene-2,5-diyl)s which forms π-stacked lamellar structures as a result of its side chain alignment as disclosed in the reference, "Extensive Studies on π-Stacking of Poly(3-alkylthiophene-2,5-diyl)s and Poly(4-alkylthiazole-2,5-diyl)s by Optical Spectroscopy, NMR Analysis, Light Scattering Analysis and X-ray Crystallography" by T. Yamamoto, et al., *J. Am. Chem. Soc.* (1998), Vol. 120, pp. 2047–2058. The existence of the structural order (of the polymer aggregates) is supported by for example spectroscopy where in an absorption spectrum the absorption maxima shifts toward longer wavelengths together with the appearance of absorption fine structures (e.g., vibronic splitting). In embodiments, the formation of polymer aggregates was verified by absorption spectroscopy measurement and by direct observation under transmission electron microscopy.

In embodiments, the composition may be a dispersion including the polymer aggregates and the liquid, wherein the dispersion may be stable for a period of time ranging for example from about a few hours to more than one month. The stability of the dispersion refers to its visual clarity with no visible separation into solid and liquid phases.

In embodiments, a different liquid may be added that is less or not capable of dissolving the polymer compared to the liquid, i.e., the liquid is a better solvent than the different liquid (the solvent properties of the liquid and different liquid are compared at the same temperature). It is believed that addition of the different liquid may change the conformation of the polymer chains and disrupt or change the intermolecular interactions, which minimize the likelihood of gelling. The different liquid is added in an amount ranging from about 1% to about 80% by volume based on the total volume of the liquid and the different liquid over a period of time ranging for instance from about 1 minutes to about 4 hours, particularly from about 10 minutes to about 1 hour. The different liquid may be added at any suitable point such as for example during the dissolution of at least a portion of the polymer in the liquid at the elevated temperature or during the lowering the temperature of the composition from the elevated temperature to the first lower temperature. The temperature of the different liquid during its addition to the composition may be the same or different from the temperature of the composition.

The different liquid may be for instance methanol, ethanol, isopropanol, hexane, heptane, acetone, and water. Therefore, the resultant composition is comprised of the polymer or polymers and the combination of the liquid and the different liquid which can be the combination of chlorobenzene/hexane, chlorobenzene/heptane, chloroform/ methanol, tetrahydrofuran/methanol, and tetrahydrofuran/ water. Agitation as described herein is used to minimize the formation of gelling of the resultant composition.

Any suitable technique may be used to deposit a layer of the composition. In embodiments, solution coating may be used. The phrase "solution coating" refers to any composition compatible coating technique such as spin coating, blade coating, rod coating, screen printing, stamping, ink jet printing, and the like.

During the depositing the layer of the composition, the composition is at a second lower temperature. The second lower temperature may be a temperature ranging from below room temperature to below the elevated temperature such as for example from about 10 to about 40 degrees C., particularly from about 20 to about 30 degrees C., and especially at room temperature. The second lower temperature and the first lower temperature may be the same or different from one another. Where the second lower temperature and/or the first lower temperature are below room temperature, suitable cooling apparatus may be employed to accomplish this. In embodiments, both the second lower temperature and the first lower temperature are at room temperature.

The deposited layer is at least partially dried, especially completely dried, using any suitable technique to remove the liquid (and if used the different liquid). When dried, the polymer aggregates collapse together and coalesce, resulting in the formation of a continuous film. Where the polymer is a self-organizable polymer, this continuous film may contain in embodiments polymer that is structurally ordered and thus corresponds to a structurally ordered layer. Drying techniques may involve for instance: directing one or more streams of air (at room temperature or at an elevated temperature) at the layer; "natural" evaporation from the layer (i.e., evaporation at room temperature without using an air stream), heating the layer while optionally applying a vacuum, or a combination of drying techniques. In embodiments where heat is employed in the drying technique, the elevated temperature may range for instance from about 40 to about 120 degrees C. at normal or reduced pressures, for a period of time ranging for instance from about 10 minutes to about 24 hours. The dry thickness of the layer is for example from about 10 nanometers to about 1 micrometer or for example from about 10 to about 150 nanometers. In embodiments, the resulting layer is a structurally ordered layer which may be the semiconductor layer of an electronic device such as a thin film transistor.

In embodiments, the present process may be used whenever there is a need to form a semiconductor layer in an electronic device. The phrase "electronic device" refers to micro- and nano-electronic devices such as, for example, micro- and nano-sized transistors and diodes. Illustrative transistors include for instance thin film transistors, particularly organic field effect transistors. The present process, however, may be used not just in fabricating electronic devices but in any process where it is difficult to deposit a layer including the polymer because of the tendency of the polymer to form a gel under certain circumstances.

In FIG. 1, there is schematically illustrated a thin film transistor ("TFT") configuration 10 comprised of a substrate 16, in contact therewith a metal contact 18 (gate electrode) and a layer of an insulating layer 14 on top of which two metal contacts, source electrode 20 and drain electrode 22, are deposited. Over and between the metal contacts 20 and 22 is an organic semiconductor layer 12 as illustrated herein.

Figure 2:
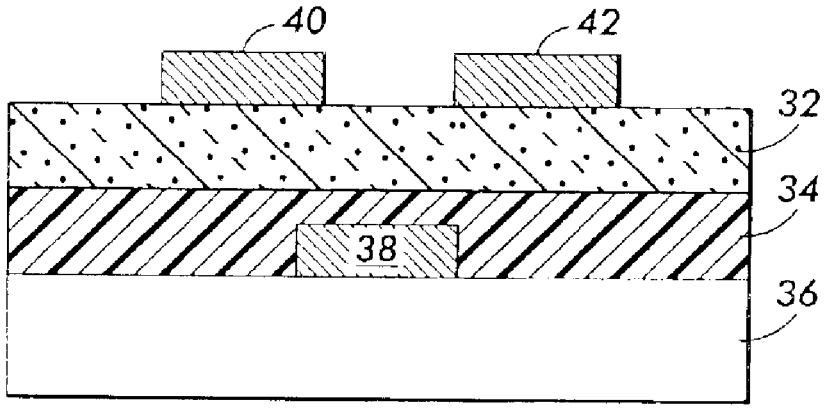
FIG. 2 represents a second embodiment of a thin film transistor made using the present process.

FIG. 2 schematically illustrates another TFT configuration 30 comprised of a substrate 36, a gate electrode 38, a source electrode 40 and a drain electrode 42, an insulating layer 34, and an organic semiconductor layer 32.

Figure 3:
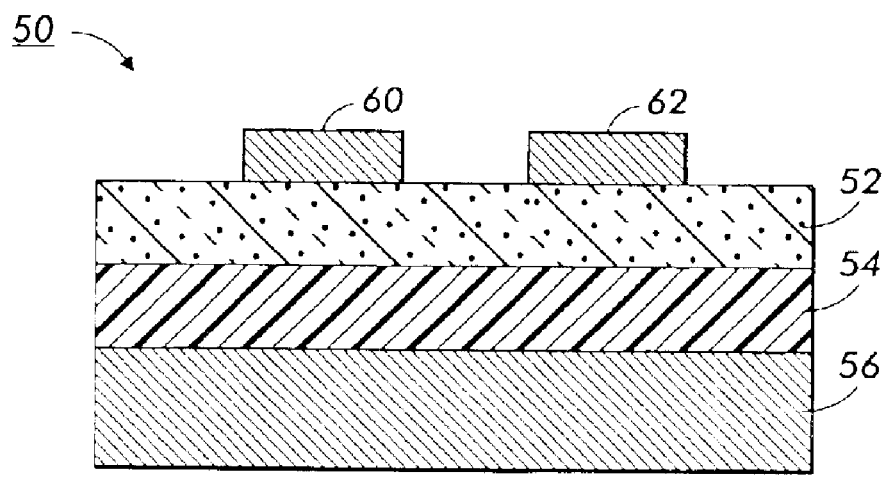
FIG. 3 represents a third embodiment of a thin film transistor made using the present process.

FIG. 3 schematically illustrates a further TFT configuration 50 comprised of a heavily n-doped silicon wafer 56 which acts as both a substrate and a gate electrode, a thermally grown silicon oxide insulating layer 54, and an organic semiconductor layer 52, on top of which are deposited a source electrode 60 and a drain electrode 62.

Figure 4:
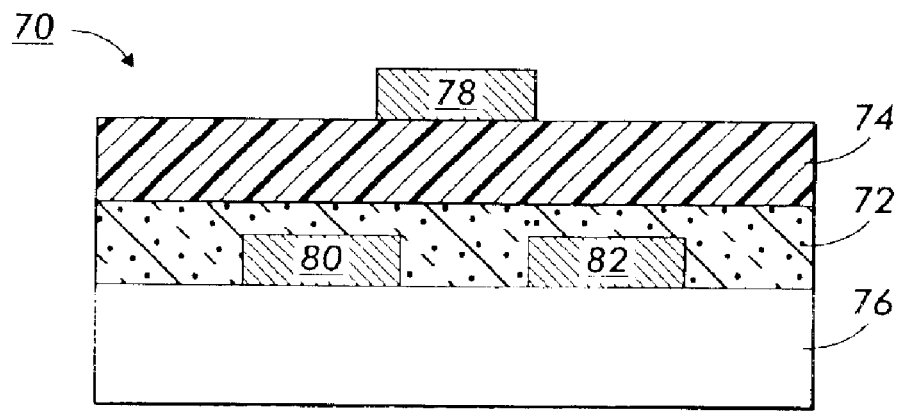
FIG. 4 represents a fourth embodiment of a thin film transistor made using the present process.

FIG. 4 schematically illustrates an additional TFT configuration 70 comprised of substrate 76, a gate electrode 78, a source electrode 80, a drain electrode 82, an organic semiconductor layer 72, and an insulating layer 74.

The composition and formation of the semiconductor layer are described herein.

The substrate may be composed of for instance silicon, glass plate, plastic film or sheet. For structurally flexible devices, plastic substrate, such as for example polyester, polycarbonate, polyimide sheets and the like may be preferred. The thickness of the substrate may be from amount 10 micrometers to over 10 millimeters with an exemplary thickness being from about 50 to about 100 micrometers, especially for a flexible plastic substrate and from about 1 to about 10 millimeters for a rigid substrate such as glass or silicon.

The compositions of the gate electrode, the source electrode, and the drain electrode are now discussed. The gate electrode can be a thin metal film, a conducting polymer film, a conducting film made from conducting ink or paste or the substrate itself, for example heavily doped silicon. Examples of gate electrode materials include but are not restricted to aluminum, gold, chromium, indium tin oxide, conducting polymers such as polystyrene sulfonate-doped poly(3,4-ethylenedioxythiophene) (PSS-PEDOT), conducting ink/paste comprised of carbon black/graphite or colloidal silver dispersion in polymer binders, such as Electrodag available from Acheson Colloids Company. The gate electrode layer can be prepared by vacuum evaporation, sputtering of metals or conductive metal oxides, coating from conducting polymer solutions or conducting inks by spin coating, casting or printing. The thickness of the gate electrode layer ranges for example from about 10 to about 200 nanometers for metal films and in the range of about 1 to about 10 micrometers for polymer conductors. The source and drain electrode layers can be fabricated from materials which provide a low resistance ohmic contact to the semiconductor layer. Typical materials suitable for use as source and drain electrodes include those of the gate electrode materials such as gold, nickel, aluminum, platinum, conducting polymers and conducting inks. Typical thicknesses of source and drain electrodes are about, for example, from about 40 nanometers to about 1 micrometer with the more specific thickness being about 100 to about 400 nanometers.

The insulating layer generally can be an inorganic material film or an organic polymer film. Illustrative examples of inorganic materials suitable as the insulating layer include silicon oxide, silicon nitride, aluminum oxide, barium titanate, barium zirconium titanate and the like; illustrative examples of organic polymers for the insulating layer include polyesters, polycarbonates, poly(vinyl phenol), polyimides, polystyrene, poly(methacrylate)s, poly(acrylate)s, epoxy resin and the like. The thickness of the insulating layer is, for example from about 10 nanometers to about 500 nanometers depending on the dielectric constant of the dielectric material used. An exemplary thickness of the insulating layer is from about 100 nanometers to about 500 nanometers. The insulating layer may have a conductivity that is for example less than about $10^{-12}$ S/cm.

The insulating layer, the gate electrode, the semiconductor layer, the source electrode, and the drain electrode are formed in any sequence as long as the gate electrode and the semiconductor layer both contact the insulating layer, and the source electrode and the drain electrode both contact the semiconductor layer. The phrase "in any sequence" includes sequential and simultaneous formation. For example, the source electrode and the drain electrode can be formed simultaneously or sequentially. The composition, fabrication, and operation of field effect transistors are described in Bao et al., U.S. Pat. No. 6,107,117, the disclosure of which is totally incorporated herein by reference.

The TFT devices contain a semiconductor channel with a width W and length L. The semiconductor channel width may be, for example, from about less than 1 micrometers to about 5 millimeters, with a specific channel width being about 5 micrometers to about 1 millimeter. The semiconductor channel length may be, for example, from about less than 1 micrometer to about 1 millimeter with a more specific channel length being from about 5 micrometers to about 100 micrometers.

The source electrode is grounded and a bias voltage of generally, for example, about 0 volt to about −80 volts is applied to the drain electrode to collect the charge carriers transported across the semiconductor channel when a voltage of generally about +40 volts to about −80 volts is applied to the gate electrode.

Regarding electrical performance characteristics, a semiconductor layer comprising the solution processed semiconducting polymer has a carrier mobility greater than for example about $10^{-3}$ cm$^2$/Vs (centimeters$^2$/Volt-second) and a conductivity less than for example about $10^{-5}$ S/cm (Siemens/centimeter). The thin film transistors produced by the present process have an on/off ratio greater than for example about $10^4$ at 20 degrees C. The phrase on/off ratio refers to the difference between the source-drain current when the transistor is on to the source-drain current when the transistor is off.

In embodiments, the charge transport capability (that is, for drain current and/or carrier mobility) of an electronic device made according to the present invention may have identical or better charge transport capability than a comparative electronic device that is prepared through conventional technologies.

The invention will now be described in detail with respect to specific preferred embodiments thereof, it being understood that these examples are intended to be illustrative only and the invention is not intended to be limited to the materials, conditions, or process parameters recited herein. All percentages and parts are by weight unless otherwise indicated.

In the following examples, a polythiophene having the structural formula (11) was used for illustration.

Synthesis of Polythiophene (11):

i) 5,5'-bis(3-dodecyl-2-thienyl)-2,2'-dithiophene: A solution of 2-bromo-3-dodecylthiophene (11.5 grams, 34.92 mmol) in 40 milliliters of anhydrous tetrahydrofuran (THF) was added slowly over a period of 20 minutes to a mechanically stirred suspension of magnesium turnings (1.26 grams, 51.83 mmol) in 10 milliliters of THF (tetrahydrofuran) in a 100 milliliter round-bottomed flask under an inert argon atmosphere. The resultant mixture was stirred at room temperature of about 22° C. to 25° C. for 2 hours, and then at 50° C. for 20 minutes before cooling down to room temperature. The resultant mixture was then added via a cannula to a mixture of 5,5'-dibromo-2,2'-dithiophene (4.5 grams, 13.88 mmol) and [1,3-bis(diphenylphosphino] dichloronickel (II) (0.189 gram, 0.35 mmol) in 80 milliliters of anhydrous THF in a 250 milliliter round-bottomed flask under an inert atmosphere, and refluxed for 48 hours. Subsequently, the reaction mixture was diluted with 200 milliliters of ethyl acetate, was washed twice with water and with a 5 percent aqueous hydrochloric acid (HCl) solution, and dried with anhydrous sodium sulfate. A dark brown syrup, obtained after evaporation of the solvent, was purified by column chromotography on silica gel yielding 5,5'-bis (3-dodecyl-2-thienyl)-2,2'-dithiophene as a yellow crystalline product in 55 percent yield, m.p. 58.9° C.

The NMR spectrum of the above obtained compound was recorded at room temperature using a Bruker DPX 300 NMR spectrometer:

$^1$H NMR (CDCl$_3$): δ 7.18 (d, J=5.4 Hz, 2H), 7.13 (d, J=3.6 Hz, 2H), 7.02 (d Hz, 2H), 6.94 (d, J=5.4 Hz, 2H), 2.78 (t, 4H), 1.65 (q, 1.65, 4H), 1.28 (bs, 36H), 0.88 (m, 6H).

ii) Polymerization: A solution of 5,5'-bis(3-dodecyl-2-thienyl)-2,2'-dithiophene (0.50 gram, 0.75 mmol) in 10 milliliters of chloroform was added slowly over a period of about 5 minutes to a well stirred mixture of FeCl₃ (0.40 gram, 2.47 mmol) in 5 milliliters of chlorobenzene in a 100 milliliter round-bottomed flask in a dry atmosphere. The resultant mixture was heated at 60° C. for 24 hours under a blanket of dry air. After the polymerization, the mixture was diluted with 20 milliliters of methylene chloride and washed three times with water. The separated organic phase was stirred with 150 milliliters of 7.5 percent of an aqueous ammonia solution for 45 minutes, washed with water until the water phase is clear, and then poured into methanol to precipitate the crude polythiophene. The final polythiophene product, which was purified by soxhlet extraction with heptane, and then with chlorobenzene, showed the following molecular weight properties: $M_w$ 22,950; $M_n$ 17250 relative to polystyrene standards.

COMPARATIVE EXAMPLE

A top-contact thin film transistor structure, as schematically described by FIG. 3, was chosen as the primary test device configuration in this Comparative Example. The test device was comprised of an n-doped silicon wafer with a thermally grown silicon oxide layer of a thickness of about 110 nanometers thereon. The wafer functioned as the gate electrode while the silicon oxide layer acted as the insulating layer and had a capacitance of about 32 nF/cm² (nanofarads/square centimeter). The fabrication of the device was accomplished under ambient conditions without any precautions being taken to exclude the materials and device from exposure to ambient oxygen, moisture, or light. The silicon wafer was first cleaned with methanol, air dried, and then immersed in a 0.01 M solution of octyltrichlorosilane in toluene for about 10 minutes at room temperature. Subsequently, the wafer was washed with dichloromethane, methanol and air-dried. The semiconductor polythiophene layer of about 30 nanometers to about 100 nanometers in thickness was then deposited on top of the silicon oxide insulating layer by spin coating a hot solution of the polythiophene (11) (at the temperature more than 60° C.) in dichlorobenzene at a speed of 1,000 rpm for about 35 seconds, and dried in vacuo at 80° C. for 20 hours.

The evaluation of field-effect transistor performance was accomplished in a black box at ambient conditions using a Keithley 4200 SCS semiconductor characterization system. The carrier mobility, $\mu$, was calculated from the data in the saturated regime (gate voltage, $V_G$<source-drain voltage, $V_{SD}$) accordingly to equation (1)

$$I_{SD}=C_i\mu(W/2L)(V_G-V_T)^2 \quad (1)$$

where $I_{SD}$ is the drain current at the saturated regime, W and L are, respectively, the semiconductor channel width and length, $C_i$ is the capacitance per unit area of the insulating layer, and $V_G$ and $V_T$ are, respectively, the gate voltage and threshold voltage. $V_T$ of the device was determined from the relationship between the square root of $I_{SD}$ at the saturated regime and $V_G$ of the device by extrapolating the measured data to $I_{SD}=0$.

An important property for the thin film transistor is its current on/off ratio, which is the ratio of the saturation source-drain current when the gate voltage $V_G$ is equal to or greater than the drain voltage $V_D$ to the source-drain current when the gate voltage $V_G$ is zero.

At least five thin film transistors were prepared with dimensions of W (width)=5,000 $\mu$m and L (length)=60 $\mu$m. The following properties were obtained and summarized in Table 1.

The performance of the devices could be improved by thermal annealing. This was accomplished by first heating the devices in an oven to a temperature of about 150° C. for about 15 minutes, and then cooling them down to room temperature before evaluation again.

EXAMPLE a) Dispersion of Polythiophene (11)

Polythiophene (11) was dissolved in dichlorobenzene at 0.3 wt % level by heating to about 120° C. The solution was filtered through a 0.2 $\mu$m syringe filter while it was hot. Yellow to reddish clear solution was obtained. The hot solution was allowed to cool down to room temperature while an ultrasonic vibration was applied with a 100 W sonicator at 42 kHz for 10 to 15 minutes. The yellow-reddish solution became dark-purple when it was completely cooled to room temperature. A stable dispersion was obtained, which can be stored at room temperature for weeks without visually observable precipitation or gelling.

b) TFT Device Fabrication and Characterization

Thin film transistors were fabricated and evaluated using the procedures of Comparative Example. In lieu of a hot solution of the polythiophene (11) in dichlorobenzene of the Comparative Example, a dispersion of the polythiophene (11) in dichlorobenzene as prepared above was used to make the semiconductor layer by spin coating at room temperature for 80 seconds. Using the transistors with the same dimension (W=5000 mm, L=60 mm), the following average properties from at least five separate transistors are summarized in table 1. Thermal annealing was performed as described before to enhance device performance.

TABLE 1

| | Before annealing | | After annealing | |
|---|---|---|---|---|
| Experiments | Mobility (cm²/V · s) | On/off ratio | Mobility (cm2/V · s) | On/off ratio |
| Comparative Example | 0.013–0.038 | >10⁶ | 0.05–0.12 | ~10⁷ |
| Example | 0.029–0.045 | >10⁶ | 0.076–0.12 | ~10⁷ |

The above results show that while the solution of polythiophene (11) in dichlorobenzene at room temperature could not be properly coated via solution processes such as spin coating, the solution could be coated at an elevated temperature of more than 60 degree C. to give a semiconductor layer that provided useful TFT properties (Comparative Example). On the other hand, in the Example, the dispersion of polythiophene (11) in dichlorobenzene could be satisfactorily processed at room temperature by spin coating to give a semiconductor layer that provided TFT properties (Example) identical to those obtained in the Comparative Example.

We claim:

1. A process comprising:

selecting a composition including a polymer and a liquid, wherein the polymer exhibits lower solubility in the liquid at room temperature but exhibits greater solubility in the liquid at an elevated temperature, wherein the composition gels when the elevated temperature is lowered to a first lower temperature without agitation;

dissolving at the elevated temperature at least a portion of the polymer in the liquid;

lowering the temperature of the composition from the elevated temperature to the first lower temperature;

agitating the composition to disrupt any gelling, wherein the agitating commences at any time prior to, simultaneous with, or subsequent to the lowering the elevated temperature of the composition to the first lower temperature;

depositing via solution coating a layer of the composition wherein the composition is at a second lower temperature lower than the elevated temperature; and drying at least partially the layer.

2. The process of claim 1, wherein the polymer is a conjugated polymer.

3. The process of claim 1, wherein the polymer is a polythiophene.

4. The process of claim 1, further comprising adding a different liquid that is less capable of dissolving the polymer than the liquid.

5. The process of claim 1, wherein the agitation is accomplished by employing ultrasonic vibration or homogenization.

6. The process of claim 1, wherein the first lower temperature is room temperature.

7. The process of claim 1, wherein the second lower temperature is room temperature.

8. The process of claim 1, wherein the first lower temperature and the second lower temperature are the same.

* * * * *

UNITED STATES PATENT AND TRADEMARK OFFICE
CERTIFICATE OF CORRECTION

PATENT NO. : 6,890,868 B2  Page 1 of 1
APPLICATION NO. : 10/273896
DATED : May 10, 2005
INVENTOR(S) : Wu et al.

It is certified that error appears in the above-identified patent and that said Letters Patent is hereby corrected as shown below:

In column 1, the following section should be added before the section title BACKGROUND OF THE INVENTION:

--STATEMENT REGARDING FEDERALLY SPONSORED RESEARCH OR DEVELOPMENT
   This invention was made with United States Government support under Cooperative Agreement No. 70NANBOH3033 awarded by the National Institute of Standards and Technology (NIST). The United States Government has certain rights in the invention.--

Signed and Sealed this

Sixth Day of March, 2007

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 6,890,868 B2 | Page 1 of 1 |
| APPLICATION NO. | : 10/273896 | |
| DATED | : May 10, 2005 | |
| INVENTOR(S) | : Wu et al. | |

It is certified that error appears in the above-identified patent and that said Letters Patent is hereby corrected as shown below:

In the Specification

In column 1, the following section should be added before the section title BACKGROUND OF THE INVENTION:

--STATEMENT REGARDING FEDERALLY SPONSORED RESEARCH OR DEVELOPMENT
   This invention was made with United States Government support under Cooperative Agreement No. 70NANB0H3033 awarded by the National Institute of Standards and Technology (NIST). The United States Government has certain rights in the invention.--

This certificate supersedes the Certificate of Correction issued March 6, 2007.

Signed and Sealed this
Seventeenth Day of September, 2013

Teresa Stanek Rea
*Deputy Director of the United States Patent and Trademark Office*